United States Patent [19]
Suh

[11] Patent Number: 6,078,978
[45] Date of Patent: Jun. 20, 2000

[54] BUS INTERFACE CIRCUIT IN A SEMICONDUCTOR MEMORY DEVICE

[75] Inventor: Jung Won Suh, Kyungki-do, Rep. of Korea

[73] Assignee: Hyundai Electronics Industries Co., Ltd., Kyoungki-do, Rep. of Korea

[21] Appl. No.: 09/098,729

[22] Filed: Jun. 18, 1998

[30] Foreign Application Priority Data

Jun. 20, 1997 [KR] Rep. of Korea ...................... 97-26186

[51] Int. Cl.⁷ .................................................. G06F 13/00
[52] U.S. Cl. ......................... 710/129; 710/126; 710/128; 710/100; 326/30
[58] Field of Search .................... 710/128, 126, 710/129, 100; 326/30

[56] References Cited

U.S. PATENT DOCUMENTS 5,634,014  5/1997  Gist et al. .............................. 395/280
5,687,330  11/1997  Gist et al. .............................. 710/129

*Primary Examiner*—Ario Etienne
*Attorney, Agent, or Firm*—Nath & Associates; Gary M. Nath; Harold L. Novick

[57] ABSTRACT

This invention relates to a bus interface circuit in a semiconductor memory device. This invention comprises a data driver to transmit a data signal through a first transmission line of which one end is terminated; a reference voltage driver to transmit a reference voltage signal through a second transmission line of which one end is terminated; and a receiver to determine a logic state by comparing the data signal transmitted by the first transmission line with the reference voltage signal transmitted by the second transmission line. Accordingly, a high-speed bus interface circuit of the present invention can decrease a common mode noise, influence of ground bounce, an output voltage swing and a power consumption by simultaneously driving a data driver and a reference voltage driver in a memory interface using a transmission line being either single or parallel terminated to transmit to a receiver.

5 Claims, 6 Drawing Sheets

BUS INTERFACE CIRCUIT IN A SEMICONDUCTOR MEMORY DEVICE

FIELD OF THE INVENTION

This invention relates to a bus interface circuit in a semiconductor memory device. In particular, it relates to a bus interface circuit, which can transfer a data signal and a reference voltage signal to a receiver by simultaneously driving a data driver with a reference voltage driver in a bus interface using a transmission line whether it is a single or parallel terminated.

DESCRIPTION OF THE RELATED PRIOR ART

A DRAM, which is used for the main memory and the video memory in a computer, requires a wide bandwidth to improve the performance of a system. To satisfy the condition of the bandwidth, study of the bus interface, through which a data signal is transmitted at high speed, should be considered. A TTL interface has been used for the last twenty years as the industry standard. However, the TTL interface causes problems such as power consumption, noise, signal reflection and ringing phenomenon in systems with speeds over 50 MHz. This is a limitation in communicating at high speed. To solve the above problem, a LVTTL (Low Voltage TTL) interface has been used widely in systems with speeds below 100 MHz due to LVTTL using a low voltage. However, since the LVTTL interface causes various problems such as power consumption and noise, etc. similar to TTL interface in systems with speeds over 100 MHz, it is difficult to apply it to any system. To overcome such a problem, GTL (Gunning Transceiver Logic) or RSL (Rambus Signaling Logic) interfaces are presented. But there is limitation in decreasing voltage variation width caused by a poor common mode noise.

JC-16 of the JEDEC (Joint Electronics Device Engineering Council) has standardized the GTL interface to the high speed SDRAM (Synchronous DRAM).

A Rambus DRAM having a bandwidth over 1.6GB/sec has used the RSL interface. Characteristics of the GTL and RSL interfaces are shown in Table 1.

TABLE 1

| Interface | Termination | Typical output voltage swing | Termination voltage | External reference voltage |
|---|---|---|---|---|
| GTL | Single | 800 mv | 1.2 V | 0.8 V |
| RSL | Single | 1 V | 2.5 V | 2.2 V |

In drawings attached to this specification, reference Rt shows a termination resistor. The termination resistor is matched with specific impedance of a transmission line and prevents reflection of a transmitted signal, thereby preventing distortion of signals. References R1 and R2 show resistors to generate a reference voltage Vref in a conventional bus interface. The resistors R1 and R2 generate the reference voltage Vref from a board by a resistance rate, in which the reference voltage is commonly used in a receiver of each chip. Single termination means that one end of the termination line is terminated, while parallel termination means that both ends of the termination line are terminated. The receiver concludes logic 1 or logic 0 by comparing a data signal transmitted to the transmission line with the reference voltage Vref. A driver is an open drain structure. The logic 1 or logic 0 is transmitted to the receiver through the transmission line by turning off or turning on a NMOS driver (See description of FIGS. 2 to 5).

FIG. 1 illustrates a concept diagram of a conventional memory interface such as a GTL interface or a RSL interface. To a transmission line that is single terminated, a data signal is transmitted. Driver 11, which is a NMOS transistor MAN having an open drain structure, is turned off to drive a data of logic 0, or turned on to drive a data of logic 0 A receiver 13, which is a comparator, compares a reference voltage Vref when created outside of a chip with a transmitted data signal to determine logic 0 or logic 1. At this time, resistors R1 and R2 in a board generate the external reference voltage in which the reference voltage is being commonly used in the receiver 13 of each chip.

As the reference voltage Vref is generated outside of the chip, variation of the termination voltage, characteristic variation of the transmission line, or variation of driving ability of a driver due to ground bounce can not be reflected. Hence, minimum voltage swing can be maintained to a desired margin but it becomes a limitation in improving high speed and low power characteristics of an interface.

In addition, to decrease EMI (Electromagnetic Interference) during a high-speed data transmission, an output voltage swing should be reduced, if possible. In case of the GTL or RSL interfaces, the output voltage swing of 800 mV or 1V is required to decrease the EMI. Hence, there is a problem in that the EMI is increases in high-speed operation.

SUMMARY OF THE INVENTION

Therefore, it is an object of the present invention to provide a high-speed bus interface circuit that can decrease a common mode noise, influence of ground bounce, an output voltage swing and a power consumption by simultaneously driving a data driver and a reference voltage driver in a memory interface using a transmission line whether it is a single or parallel terminated to transmit to a receiver.

To achieve the above objective, a high-speed bus interface circuit of the present invention comprises a data driver to transmit a data signal through the first transmission line of which one end is terminated; a reference voltage driver to transmit a reference voltage signal through the second transmission line of which one end is terminated; and a receiver to determine a logic state by comparing the data signal transmitted by the first transmission line with the reference voltage signal transmitted by the second transmission line.

The data driver and the reference voltage driver are consisted of a MOS transistor having a open driver structure. The data driver and the reference voltage driver can be consisted of a bipolar transistor having open collector structure. The driving current of the data driver is larger than that of the reference voltage driver. The data signal and reference voltage signal maintains a termination voltage level at a stand-by state, and during transmission of the data signal and the reference voltage signal, the reference voltage driver is operated so that a voltage level of Vtt-ΔVR is obtained. Furthermore, the data driver is turned off so that a data of logic 0 becomes a termination voltage level, and the driver is turned on so that a data of logic 1 becomes Vtt-ΔVD.

A high-speed bus interface circuit comprises of the first chip having N data driver to transmit N data signals through transmission lines of which one end is terminated and M reference voltage driver to transmit a reference voltage signal through a transmission line of which one end is terminated and N receiver determines the logic state by comparing the data signals transmitted by the transmission lines with the reference voltage signal transmitted by the transmission line; a second chip having N data driver to transmit N data signals through transmission lines of which one end is terminated and M reference voltage driver to transmit a reference voltage signal through a transmission line of which one end is terminated and N receiver determines the logic state by comparing the data signals transmitted by the transmission lines with the reference voltage signal transmitted by the transmission line; a plurality of transmission lines of which one end is terminated to transmit N data signals between the first chip and the second chip; and a plurality of transmission lines of which one end is terminated to transmit M reference voltage signals between the first chip and the second chip.

A high-speed bus interface circuit comprises of a data driver to transmit a data signal through a first transmission line of which both ends are terminated; a reference voltage driver to transmit a reference voltage signal through a second transmission line of which both ends are terminated; and a receiver to determine a logic state by comparing the data signal transmitted by the first transmission line with the reference voltage signal transmitted by the second transmission line.

A high-speed bus interface circuit comprises of the first chip having N data driver to transmit N data signals through transmission lines of which both ends are terminated and M reference voltage driver to transmit a reference voltage signal through a transmission line of which both ends are terminated and N receiver to determine a logic state by comparing the data signals transmitted by the transmission lines with the reference voltage signal transmitted by the transmission line; a second chip having N data driver to transmit N data signals through transmission lines of which both ends are terminated and M reference voltage driver to transmit a reference voltage signal through a transmission line of which both ends are terminated and N receiver determines the logic state by comparing the data signals transmitted by the transmission lines with the reference voltage signal transmitted by the transmission line; a plurality of transmission lines of which both end are terminated to transmit N data signals between the first chip and the second chip; and a plurality of transmission lines of which both ends are terminated to transmit M reference voltage signals between the first chip and the second chip.

Therefore, a high-speed bus interface circuit according to the present invention is suitable for a high-speed memory interface or a bus interface for an ASIC operating under a high-speeds. Also, this invention accomplishes high speed and low power consumption since influence due to a common mode noise and voltage swing is small.

BRIEF DESCRIPTION OF THE DRAWINGS

For a full understanding of the nature and objects of the present invention, references should be made to the following detailed descriptions made in conjunction with the accompanying drawings in which.

Similar reference characters refer to similar parts throughout several views of the drawings.

DETAILED DESCRIPTION OF THE PRESENT INVENTION

Below, embodiments of the present invention will be explained with reference to attached drawings.

Figure 1:
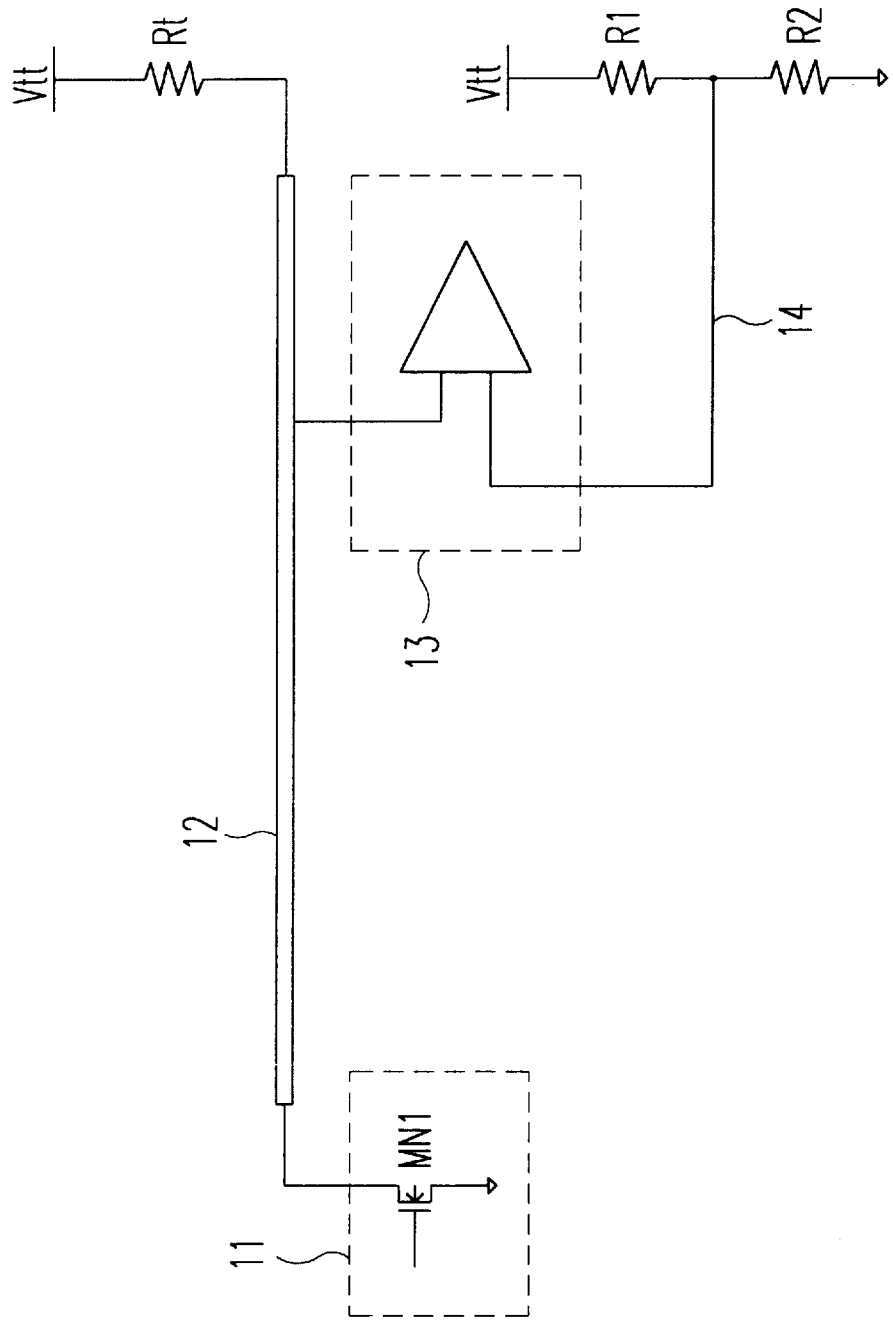
FIG. 1 illustrates a concept diagram of a conventional bus interface.
Figure 2A:
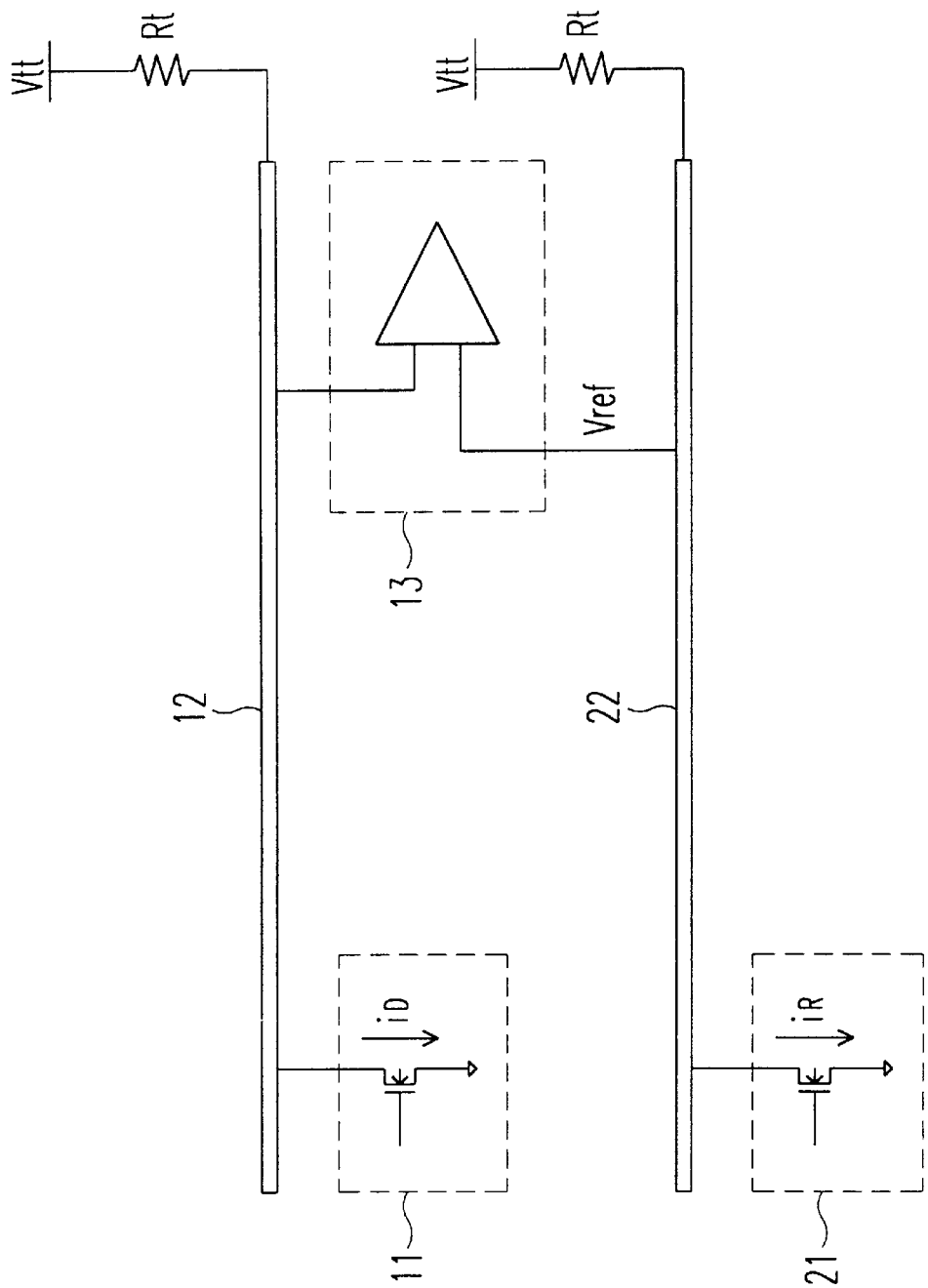
FIG. 2A illustrates a concept diagram of a high-speed bus interface according to the first embodiment of the present invention.

FIG. 2A illustrates a concept diagram of a high-speed bus interface according to the first embodiment of the present invention. In FIG. 2A, a bus interface has a data driver 11, a reference voltage driver 21 and a receiver 13. The data driver 11 transmits a data signal through a transmission line 12 that is single terminated. The reference voltage driver 21 transmits a reference voltage signal through a transmission line 22 that is single terminated. The receiver 13 determines logic state by comparing the data signal transmitted through the transmission line 12 with the reference voltage signal transmitted which goes through the transmission line 22.

In the present invention, the reference voltage signal is transmitted to the receiver 13 through a transmission line having identical environment to a transmission line for the data signal, which is different from GTL or RSL interfaces. If the transmission line 12 for the data signal and the transmission line for the reference voltage signal are suitably arranged, the transmission lines are identically affected by a common mode noise. Generally, the receiver 13 uses a differential amplifier, whereby the common mode noise affecting to the transmission lines 12 and 22 can be reduced. In a conventional memory interface, environment of the transmission line for the data signal is different that of the transmission line for the reference voltage signal. Also, in a chip in which a plurality of drivers is operated, much current simultaneously flows, thereby causing a ground bounce. When a driving condition of a data driver is changed due to the ground bounce, a driving condition of the reference voltage driver is also changed. Accordingly, influence of the ground bounce can be decreased.

In FIG. 2A, the condition of iD>Ir is satisfied since the data driver 11 has a large driving current in comparing with the reference voltage driver 21, where, iD is the driving current of the data driver and iR is the driving current of the reference voltage driver.

Figure 2B:
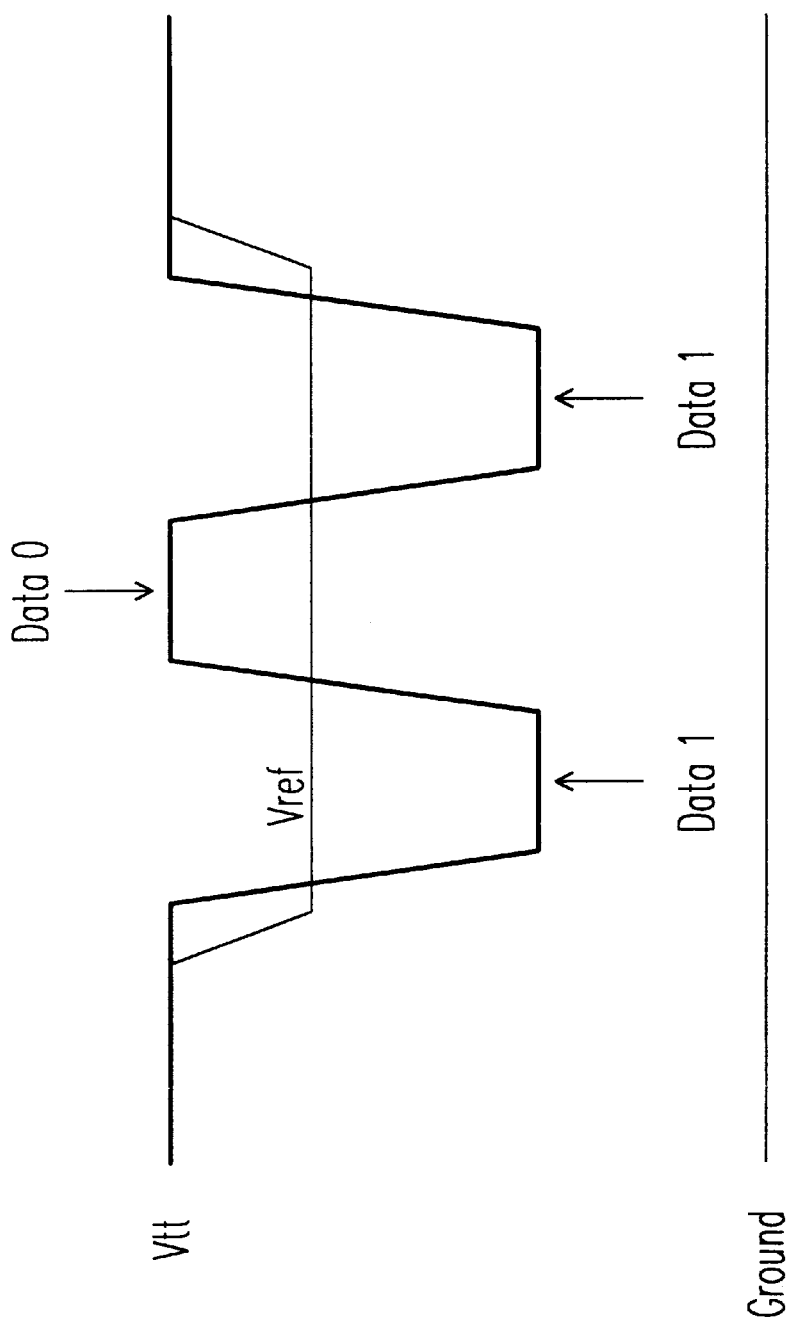
FIG. 2B is a waveform of a data signal and a reference voltage in a high-speed bus interface according to the first embodiment of the present invention.

FIG. 2B is a waveform of a data signal and a reference voltage signal in a high-speed bus interface according to a first embodiment of the present invention. In Stand-by State, the data signal and the reference voltage signal Vref are maintained at a voltage level of Vtt. When the data driver 11 is operated and the data signal is transmitted to the receiver 13 through the transmission line 12, the reference voltage driver 21 is activated to generate a voltage level of Vtt-$\Delta$VR and then the data driver 11 is operated. A data of logic 0 becomes a voltage level of Vtt by turning off the data driver 11, while data of logic 1 becomes a voltage level of Vtt-$\Delta$VD by turning on the data driver 11. In present invention, iD of the data driver is larger than Ir of the reference voltage driver, and therefore the condition of $|\Delta VD|>|\Delta VR|$ is satisfied. FIG. 2B shows a data signal and reference voltage signal when logical data 1, logical data 0 and logical data 1 transmit continues.

Figure 3:
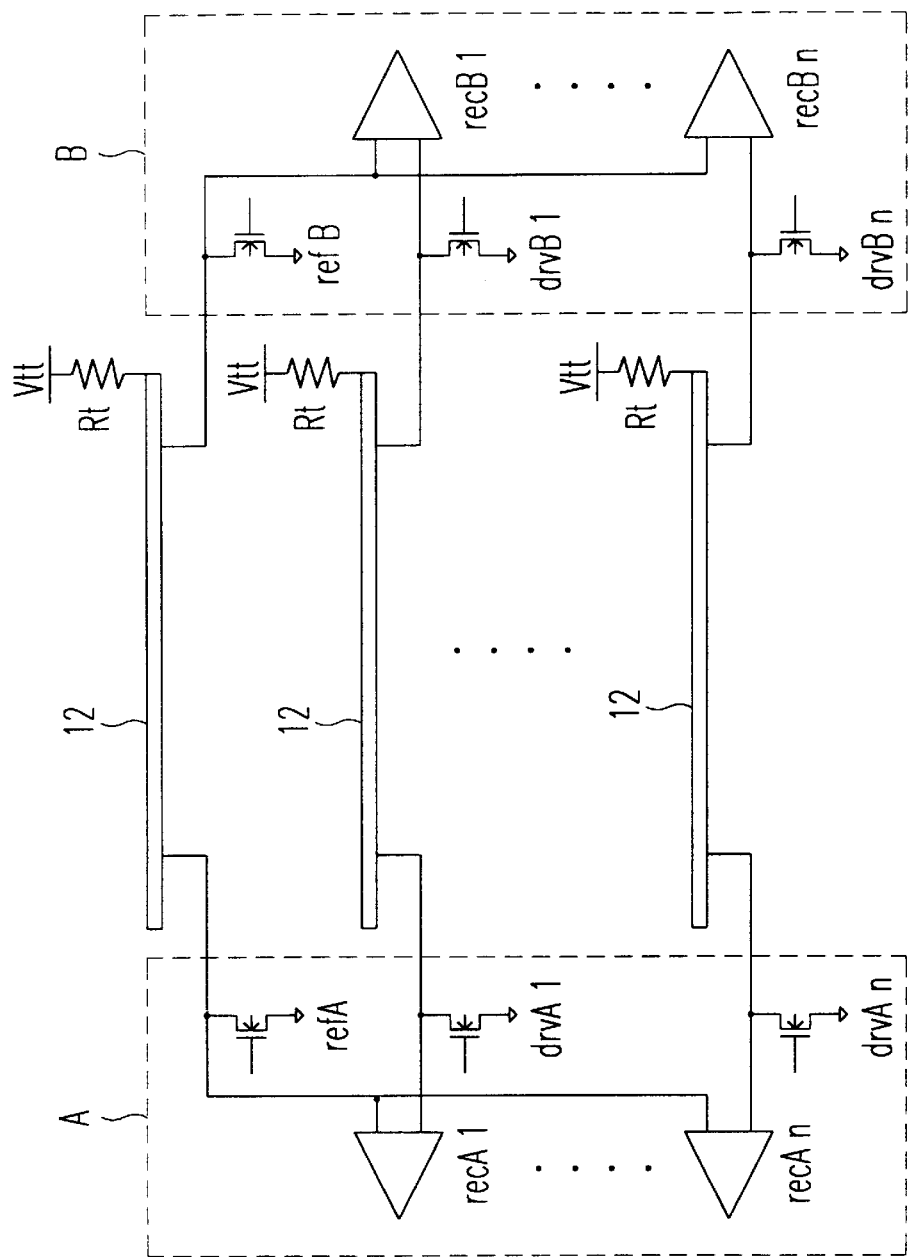
FIG. 3 is a circuit of a high-speed bus interface to realize FIG. 2A.

FIG. 3 is a circuit of a high-speed bus interface which realizes the first embodiment. First chip includes a plurality of data drivers drvA1 through drvAn to transmit a plurality of data signals through transmission lines that are single terminated. The reference voltage driver refA transmits a reference voltage signal through a transmission line that is single terminated. and plurality of receivers recA1 through recAn to determine a logic state by comparing the data signals transmitted by the transmission lines with the reference voltage signal. Construction of a second chip B is identical to that of the first chip A. A plurality of transmission lines to transmit a plurality of data signals, and a transmission line to transmit the reference voltage signal are connected between chip A and chip B, in which the transmission lines are single terminated. FIG. 3 shows connection between a driver and a receiver when transmission of the data signal between the first chip A and the second chip B. For example, if a plurality of data signals are transmitted from first chip A to second chip B through the transmission lines, the data drivers drvA1 through drvAn and the reference voltage driver refA in the first chip A are driven. Accordingly, the data signal and the reference voltage signal are transmitted to the receivers recB1 through rccBn in the second chip B. Similarly, if a plurality of data signals are transmitted from the second chip B to the first chip A through the transmission lines, the data drivers drvB1 through drvBn and the reference voltage driver refB in the second chip B are driven. Thus, the data signal and the reference voltage signal are transmitted to the receivers recA1 through rccAn in the first chip A.

Figure 4:
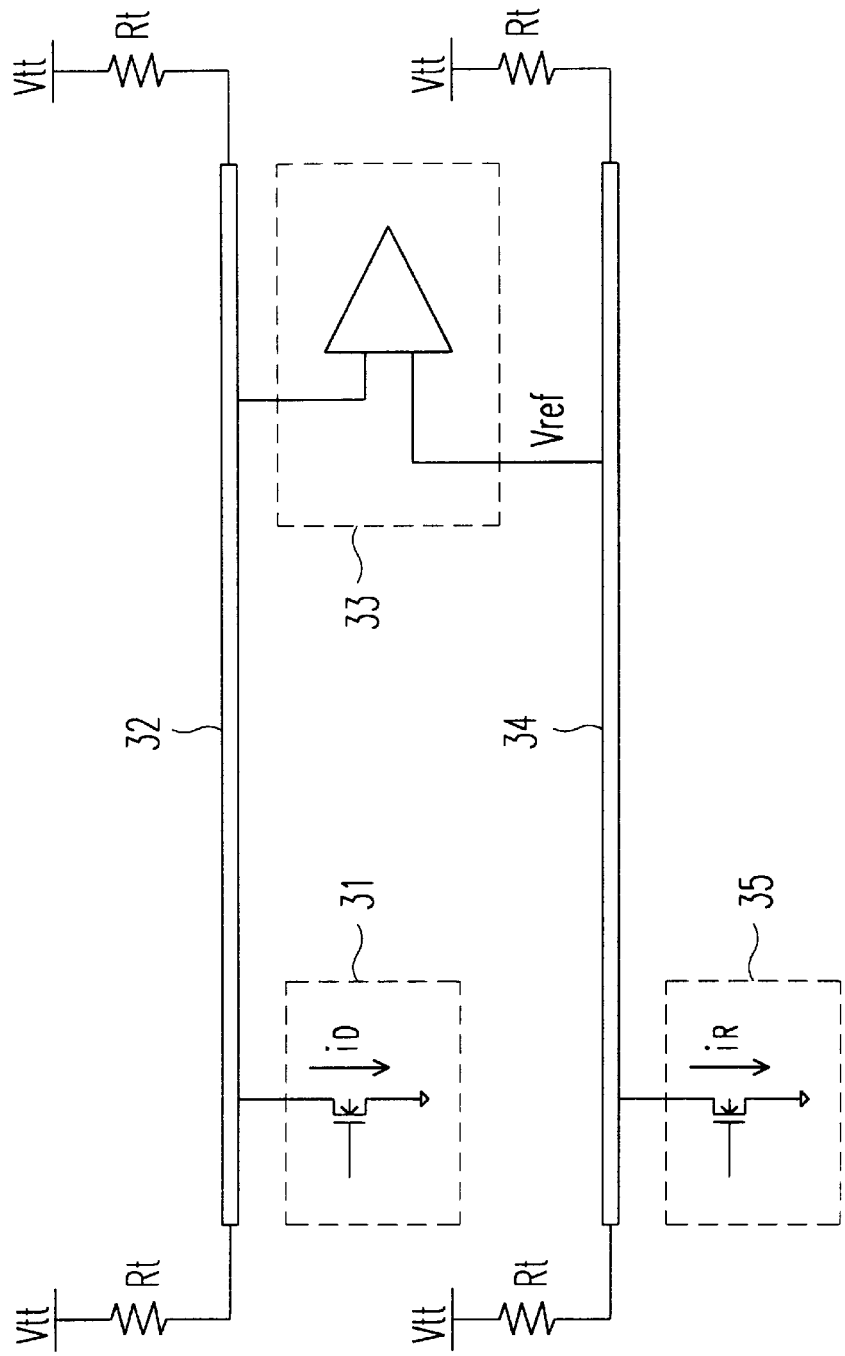
FIG. 4 illustrates a concept diagram of a high-speed bus interface according to the second embodiment of the present invention.

FIG. 4 illustrates a concept diagram of a high-speed bus interface according to the second embodiment of the present invention. The high-speed bus interface consists of a transmission line that is parallel terminated where the high-speed bus interface is different from FIG. 2A. The high-speed bus interface has a data driver 31 to transmit a data signal through a transmission line that is parallel terminated, a reference voltage driver 35 to transmit a reference voltage signal to a transmission line that is parallel terminated and a receiver 33 to determine a logic state by comparing a data signal transmitted through the transmission line with the reference voltage signal.

As described above, the reference voltage signal Vref and the data signal are transmitted to the receiver 33 through the transmission line having identical environment. If the transmission line for the data signal and the transmission line for the reference voltage signal are arranged as in FIG. 4, the common mode noise affecting to the transmission lines can be reduced. When a driving condition of the data driver 31 is changed due to the ground bounce, the driving condition of the reference voltage driver 32 is also changed as described in FIG. 2A. Accordingly, influence of the ground bounce can be decreased. When the transmission line is parallel terminated, signal reflection from both ends of the transmission line can be prevented and signal distortion is decreased compared to the single termination. However, the driving current of the data driver 31 and the reference voltage driver 32 is increased, whereby power consumption is increased.

Figure 5:
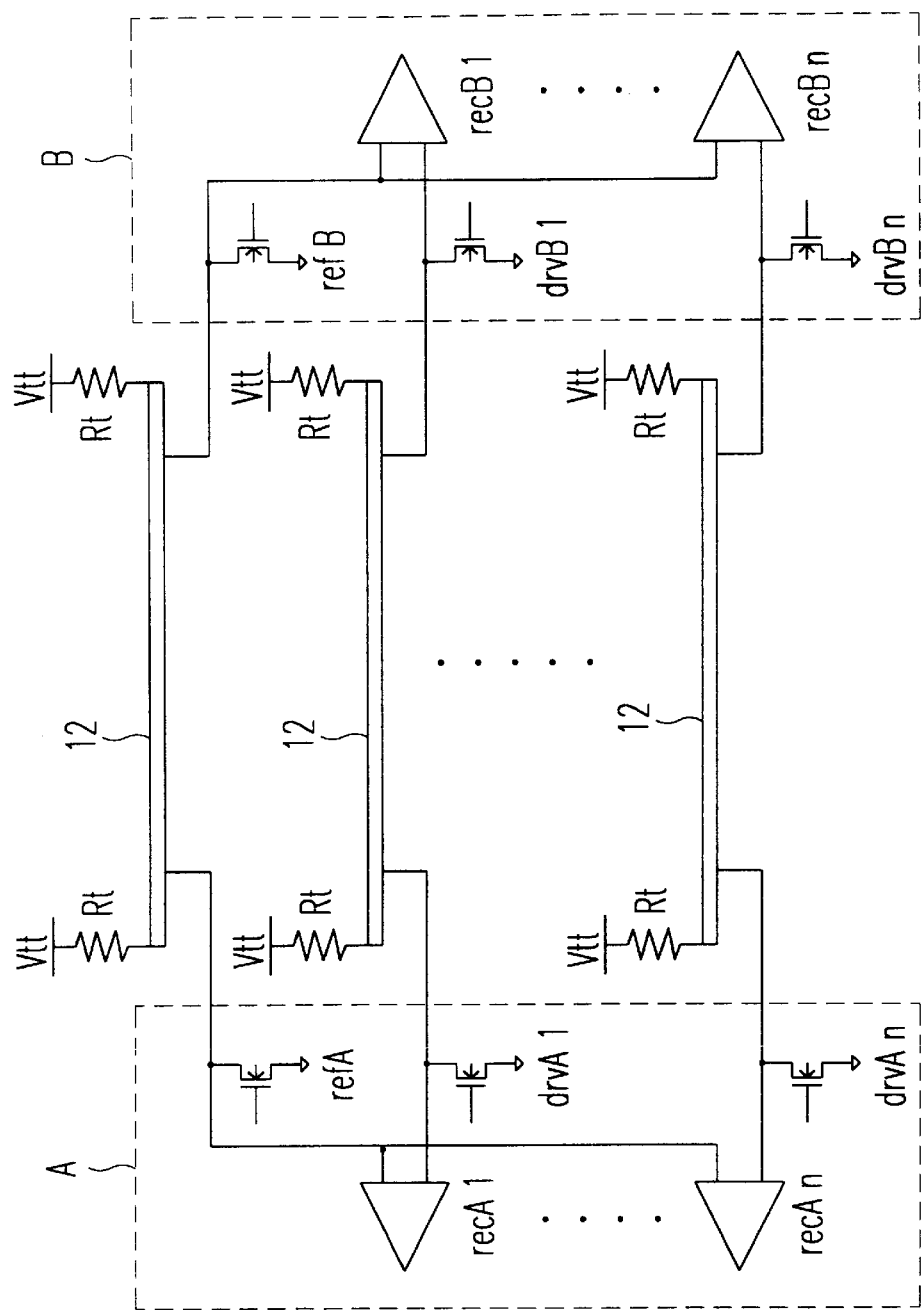
FIG. 5 is a circuit of a high-speed bus interface to realize FIG. 4.

FIG. 5 is a circuit of a high-speed bus interface to realize the second embodiment of FIG. 4. First chip includes a plurality of data drivers drvA1 through drvAn which transmit a plurality of data signal through transmission lines that are parallel terminated, a reference voltage driver refA to transmit a reference voltage signal through a transmission line that is parallel terminated and a plurality of receivers recA1 through recAn to determine a logic state by comparing the data signals transmitted by the transmission lines with the reference voltage signal. Construction of a second chip B is identical to that of the first chip A. A plurality of transmission lines transmit a plurality of data signals, and a transmission line that transmits the reference voltage signal are connected between the chip A and the chip B, in which the transmission lines are parallel terminated.

FIG. 5 shows connection between a driver and a receiver when transmission of the data signal between the first chip A and the second chip B occurs under the parallel termination environment. For example, if a plurality of data signals are transmitted from the first chip A to the second chip B through the transmission lines, the data drivers drvA1 through drvAn and the reference voltage driver refA in the first chip A are driven. Accordingly, the data signal and the reference voltage signal are transmitted to the receivers recB1 through rccBn in the second chip B. Similarly, if a plurality of data signals are transmitted from the second chip B to the first chip A through the transmission lines, the data drivers drvB1 through drvBn and the reference voltage driver refB in the second chip B are driven. Accordingly, the data signal and the reference voltage signal are transmitted to the receivers recA1 through rccAn in the first chip A.

As described above, according to the high-speed bus interface of the present invention, influence due to the ground bounce can be decreased since a reference voltage signal is generated by the reference voltage driver having the same condition as the data driver without the use of external reference voltage. Also, influence due to the common noise can be decreased by suitably arranging transmission lines for the data signal and the reference voltage signal. Furthermore, this invention can decrease excessive power consumption during stand-by state since the reference voltage signal is only drive operating during driving of a data and maintains a voltage level of Vtt. It is possible to decrease power consumption and the EMI since the output voltage swing can be decreased in compare with a conventional bus interface.

Although this invention has been described in its preferred form with a certain degree of particularity, it is appreciated by those skilled in the art that the present disclosure of the preferred form has been made only by way example and that numerous changes in the details of the construction, combination and arrangement of parts may be resorted to without departing from the spirit and scope of the invention.

What is claimed is:

1. A high-speed bus interface circuit comprising:
   a data driver to transmit a data signal through a first transmission line of which one end is terminated;
   a reference voltage driver to transmit a reference voltage signal through a second transmission line of which one end is terminated; and
   a receiver to determine a logic state by comparing the data signal transmitted by the first transmission line with the reference voltage signal transmitted by the second transmission line,
   wherein the levels of the data signal and the reference voltage signal maintain a termination voltage level Vtt at a stand-by state,
   wherein the level of the reference voltage signal becomes Vtt-$\Delta$Vr when the reference voltage driver is driven,
   wherein when the data signal is logic 0 the data driver is turned off so that the level of the data signal becomes the termination voltage level Vtt and when the data signal is logic 1 the data driver is turned on so that the level of the data signal becomes Vtt-$\Delta$VD, and
   wherein $|\Delta VD|>|\Delta Vr|$.

2. The circuit of claim 1, wherein the data driver and the reference voltage driver are consisted of a MOS transistor having an open driver structure.

3. The circuit of claim 2, wherein the driving current of the data driver is larger than that of the reference voltage driver.

4. The circuit of claim 1, wherein the data driver and the reference voltage driver are consisted of a bipolar transistor having an open collector structure.

5. A high-speed bus interface circuit comprising:
- a data driver to transmit a data signal through a first transmission line of which both ends are terminated;
- a reference voltage driver to transmit a reference voltage signal through a second transmission line of which both ends are terminated; and
- a receiver to determine a logic state by comparing the data signal transmitted by the first transmission line with the reference voltage signal transmitted by the second transmission line, wherein the levels of the data signal and the reference voltage signal maintain a termination voltage level Vtt at a stand-by state, wherein the level of the reference voltage signal becomes Vtt-$\Delta$Vr when the reference voltage driver is driven, wherein when the data signal is logic 0 the data driver is turned off so that the level of the data signal becomes the termination voltage level Vtt and when the data signal is logic 1 the data driver is turned on so that the level of the data signal becomes Vtt-$\Delta$VD, and wherein $|\Delta VD|>|\Delta Vr|$.

\* \* \* \* \*